US006927074B2

United States Patent
Hsu et al.

(10) Patent No.: US 6,927,074 B2
(45) Date of Patent: Aug. 9, 2005

(54) ASYMMETRIC MEMORY CELL

(75) Inventors: Sheng Teng Hsu, Camas, WA (US);
Tingkai Li, Vancouver, WA (US);
David R. Evans, Beaverton, OR (US)

(73) Assignee: Sharp Laboratories of America, Inc., Camas, WA (US)

( * ) Notice: Subject to any disclaimer, the term of this patent is extended or adjusted under 35 U.S.C. 154(b) by 230 days.

(21) Appl. No.: 10/442,627

(22) Filed: May 21, 2003

(65) Prior Publication Data

US 2004/0233708 A1 Nov. 25, 2004

(51) Int. Cl.[7] .............................................. H01L 21/00
(52) U.S. Cl. ........................................... 438/3; 438/381
(58) Field of Search ............................ 438/3, 381, 385; 257/295, 317

(56) References Cited

U.S. PATENT DOCUMENTS

| | | | | |
|---|---|---|---|---|
| 5,740,100 A | * | 4/1998 | Yoo | 365/145 |
| 6,005,800 A | * | 12/1999 | Koch et al. | 365/173 |
| 6,649,954 B2 | * | 11/2003 | Cross | 257/295 |
| 6,759,249 B2 | * | 7/2004 | Zhuang et al. | 438/3 |

OTHER PUBLICATIONS

Article entitled, "Electric–Pulse–Induced Reversible Resistance Change Effect in Magnetoresistive Films", by S. Q. Liu, N. J. Wu and A. Ignatiev, published in Applied physics Letters, vol. 76, No. 19, May 8, 2000, pp 2749–2751.

* cited by examiner

Primary Examiner—David Nelms
Assistant Examiner—Quoc Hoang
(74) Attorney, Agent, or Firm—David C. Ripma; Joseph P. Curtin

(57) ABSTRACT

An asymmetric memory cell and method for forming an asymmetric memory cell are provided. The method comprises: forming a bottom electrode having a first area; forming an electrical pulse various resistance (EPVR) material overlying the bottom electrode; forming a top electrode overlying the EPVR layer having a second area, less than the first area. In some aspects the second area is at least 20% smaller than the first area. The EPVR is a material such as colossal magnetoresistance (CMR), high temperature super conducting (HTSC), or perovskite metal oxide materials. The method further comprises: inducing an electric field between the electrodes; inducing current flow through the EPVR adjacent the top electrode; and, in response to inducing current flow through the EPVR adjacent the top electrode, modifying the resistance of the EPVR. Typically, the resistance is modified within the range of 100 ohms to 10 mega-ohms.

20 Claims, 3 Drawing Sheets

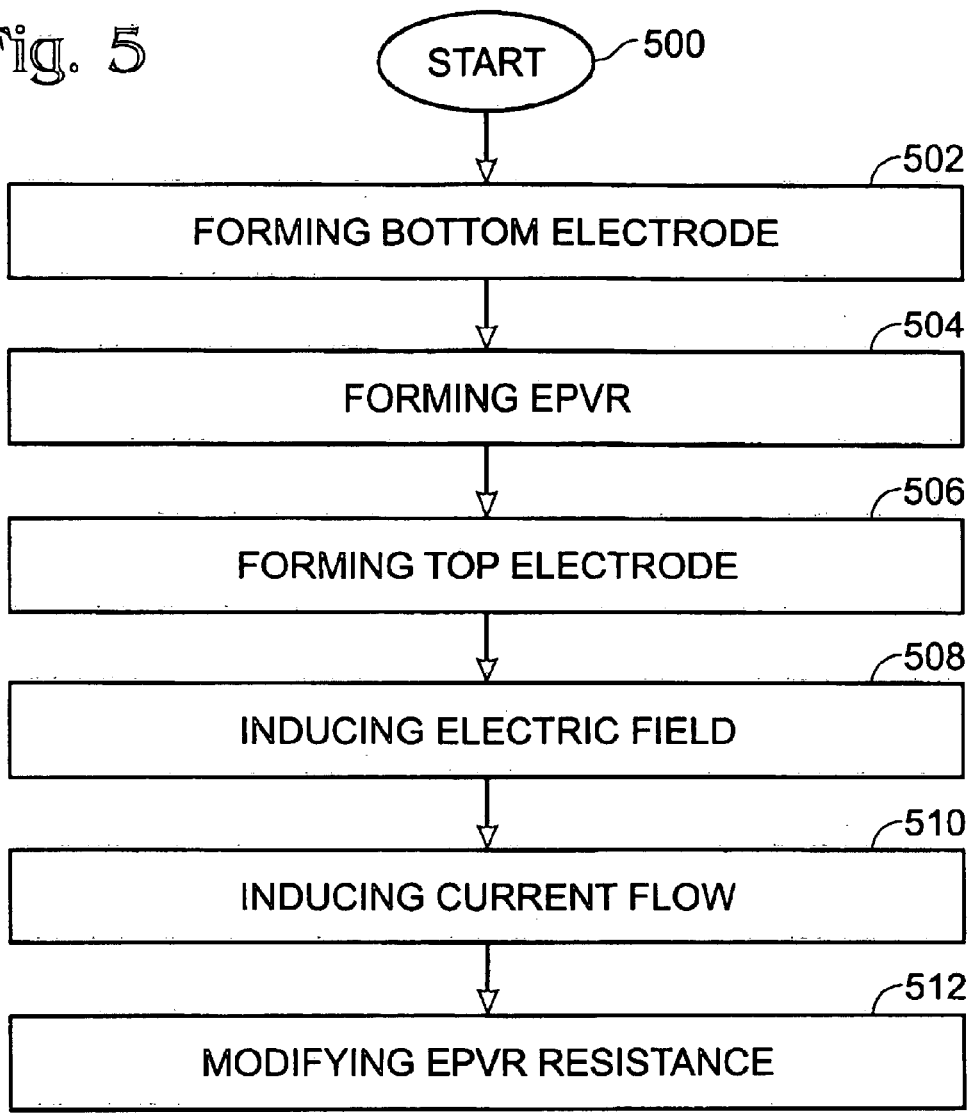

ASYMMETRIC MEMORY CELL

BACKGROUND OF THE INVENTION

1. Field of the Invention

This invention generally relates to integrated circuit (IC) memory cell arrays and, more particularly, to an asymmetrical memory resistance memory cell and method for fabricating the same.

2. Description of the Related Art

Conventionally, memory cells using a memory resistor material, such as colossal magnetoresistance (CMR) materials, are fabricated with large unpatterned conductive bottom electrodes, unpatterned CMR material, and relatively small top electrodes. These devices work in limited applications, but they are not suitable for dense memory array applications because of relatively large size of these cells.

The CMR material can be said to have a non-volatile nature, as the resistance of the CMR material remains constant under most circumstances. However, when a high electric field induces current flow through the CMR material, a change in the CMR resistance can result. During a programming process, the resistivity of the memory resistor at the high field region near the electrode changes first. Experimental data shows that the resistivity of the material at the cathode, referred as terminal A, is increased while that at the anode, referred as terminal B, is decreased. During the erase process the pulse polarity is reversed. That is, the designation of cathode and anode are reversed. Then, the resistivity of the material near terminal A is decreased, and the resistivity near terminal B is increased.

As the demand increases for cell memory, there is increased motivation to reduce the size of cells in the array. However, smaller feature sizes make the device more susceptible to process tolerance errors. Due to process tolerances, extremely small geometrically asymmetric devices are not always practical. However, an analysis (provided below) shows that fabricated memory cells that are sufficiently geometrically symmetric will not work properly. Even if these symmetrical devices can be programmed, the net resistance change from high resistance-state to low resistance-state may be relatively low.

It would be advantageous if memory cells could be designed with enough asymmetry to guarantee significant resistance state changes despite process tolerancing.

SUMMARY OF THE INVENTION

The present invention describes a thin film resistance memory device for non-volatile memory array and analog resistance applications. The device memory properties are dependent upon the asymmetrical structure of the memory cell.

Accordingly, a method is provided for forming an asymmetric memory cell. The method comprises: forming a bottom electrode having a first area; forming an electrical pulse various resistance (EPVR) material overlying the bottom electrode; forming a top electrode overlying the EPVR layer having a second area, less than the first area. In some aspects the top electrode second area is at least 20% smaller than the bottom electrode first area. The EPVR is formed from a material such as colossal magnetoresistance (CMR), high temperature super conducting (HTSC), or perovskite metal oxide materials.

The method may further comprise: inducing an electric field between the top electrode and the bottom electrode; and, in response to the electric field, inducing current flow through the EPVR adjacent the top electrode.

The method further comprises: in response to inducing current flow through the EPVR adjacent the top electrode, modifying the resistance of the EPVR between the top and bottom electrodes. More specifically, the second EPVR region resistance is modified and the first EPVR region resistance remains constant. Typically, the resistance is modified within the range of 100 ohms to 10 mega-ohms (Mohms).

Additional details of the above-described method and an asymmetrical memory cell are provided below.

BRIEF DESCRIPTION OF THE DRAWINGS

FIG. 5 is a flowchart illustrating the present invention method for forming an asymmetric memory cell.

DETAILED DESCRIPTION OF THE PREFERRED EMBODIMENTS

Figure 1A:
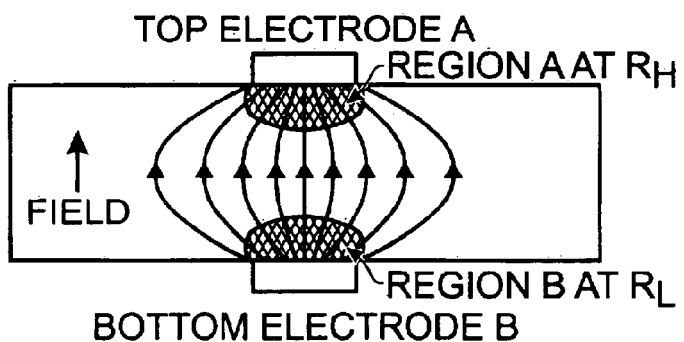
FIGS. 1A and 1B are partial cross-sectional views of a memory cell during programming (FIG. 1A) and erasing (FIG. 1B) operations.
Figure 1B:
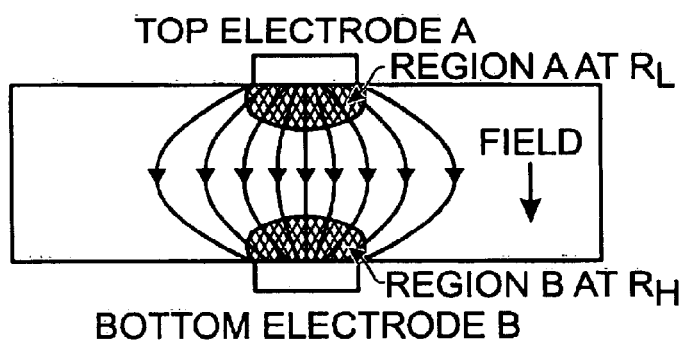

FIGS. 1A and 1B are partial cross-sectional views of a memory cell during programming (FIG. 1A) and erasing (FIG. 1B) operations. The top and bottom electrodes are identical and the memory resistance material is uniform throughout. If the geometric structure of the device could be made perfectly symmetrical, the net resistance would remains constant, in a high-resistance state, when either a negative field (FIG. 1A) or a positive field (FIG. 1B) is applied. Note that a field direction is defined with respect to the top electrode. That is, the field is considered to be induced from the top electrode. In such circumstances, programming is not possible. Therefore, a geometrically symmetric device structure, such as one in FIGS. 1A and 1B, is not practical.

More specifically, the geometrically symmetric memory cell has a high current density near the electrodes (regions A and B), and a low current density in the center portion of the device, in the presence of an electric field. As a result, the resistivity of the CMR material near the top and bottom electrodes is changed. For example, the memory cell can be programmed to be in the high-resistance state if the resistivity of the memory resistor material near the top electrode is increased, and the resistivity of memory resistor material near the bottom electrode is decreased. When the polarity of the electric pulse applied to top electrode is reversed (becomes a positive pulse, FIG. 1B), the material near the top electrode (Region A) becomes low resistance (RL), while the material near the bottom electrode (Region B) becomes high resistance (RH). However, the overall resistance of the memory resistance remains the same, still in the high-resistance state. Therefore, it is not possible to program the memory resistor to the low-resistance state.

Since region A and region B are very close to the top and bottom electrode, respectively, and their thicknesses may be as thin as a 10 nanometers (nm), the above-described effect may be mistakenly classified as an interface effect. However, memory is not an interface property change, but is a bulk resistivity change.

Figure 2A:
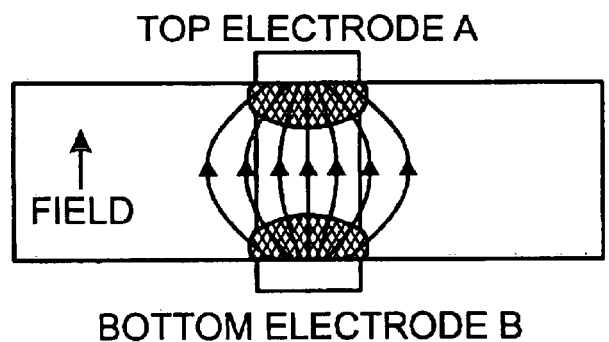
FIGS. 2A and 2B are partial cross-sectional views of a memory cell, where the memory resistor has a cylindrical shape and is embedded in oxide or any suitable insulator.
Figure 2B:
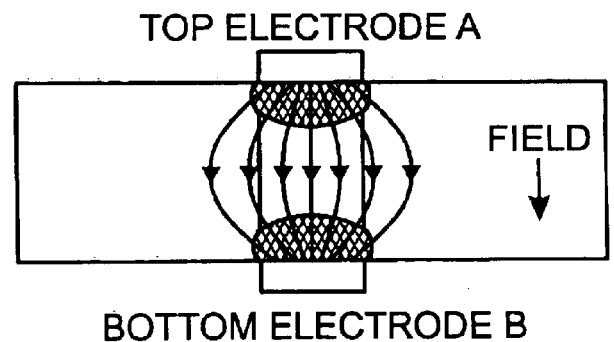

FIGS. 2A and 2B are partial cross-sectional views of a memory cell, where the memory resistor has a cylindrical shape and is embedded in oxide or any suitable insulator (prior art). The field intensity is high near both top and bottom electrodes. Since the field direction near the top electrode is opposite that near the bottom electrode, the resistivity of the memory resistor material near the top electrode is increased while the resistivity of the memory resistor material near the bottom electrode is reduced. As a result, the memory resistance is programmed to the high-resistance state regardless of whether a positive or negative pulse is applied to the top electrode. Again, a geometrically symmetric structure is not suitable for resistor memory cell.

Figure 3:
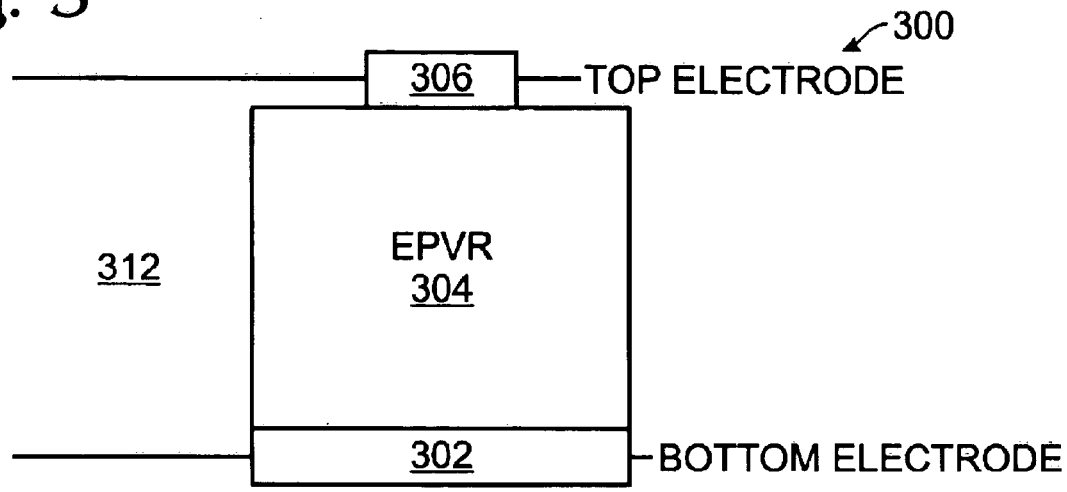
FIG. 3 is a partial cross-sectional view of the present invention asymmetric memory cell.

FIG. 3 is a partial cross-sectional view of the present invention asymmetric memory cell. The memory cell 300 comprises a bottom electrode 302 having a first area and an electrical pulse various resistance (EPVR) material layer 304 overlying the bottom electrode 302. A top electrode 306 overlies the EPVR layer 304. The top electrode 306 has a second area less than the first area. In some aspects, the top electrode second area is at least 20% less than the bottom electrode first area. Note that the top electrode 306 is shown as the smaller of the two electrodes. However, in other aspects of the invention (not shown), the cell 300 would operate equivalently with the bottom electrode 302 being 20% smaller than the top electrode 306.

As used herein, an electrode area is defined to be the surface area in contact with the EPVR layer 304. Although the top and bottom electrode surfaces are depicted as flat where they contact the EPVR layer, they need not necessarily be so.

The EPVR layer 304 is a material such as colossal magnetoresistance (CMR), high temperature super conducting (HTSC), or perovskite metal oxide materials. The bottom electrode 302 is a material such as Pt, TiN, TaN, TiAlN, TaAlN, Ag, Au, or Ir. Likewise, the top electrode 306 is a material such as Pt, TiN, TaN, TiAlN, TaAlN, Ag, Au, or Ir. The top and bottom electrodes need not necessarily be made from the same material.

Considered as a whole, the EPVR layer 304 has a first overall resistance, as measured between the top and bottom electrodes 306/302, responsive to a first voltage pulse, applied between the top and bottom electrodes 306/302. For example, the first voltage pulse can create a negative field from the perspective of the smaller top electrode 306. The EPVR layer 304 has a second overall resistance, less than the first resistance, responsive to a second voltage pulse. For example, the second voltage pulse can create a positive field from the perspective of the top electrode 306.

The EPVR layer first resistance is in the range of 100 ohms to 10 Mohms, responsive to the first voltage pulse having an negative amplitude in the range of 2 to 5 volts and a time duration in the range of 1 nanosecond (ns) and 10 microseconds (µs). The EPVR layer second resistance is in the range of 100 ohms to 1 kohm, responsive to the second voltage pulse having an positive amplitude in the range of 2 to 5 volts and a time duration in the range of 1 ns to 10 µs.

Functional Description

To overcome the problems inherent with the symmetrical memory cell mentioned in the Background Section above, an asymmetric resistor memory structure has been developed. The top electrode is relatively small, compared to the size of the bottom electrode. In one aspect, the bottom electrode area 1.3 times larger than the top electrode.

Figure 4A:
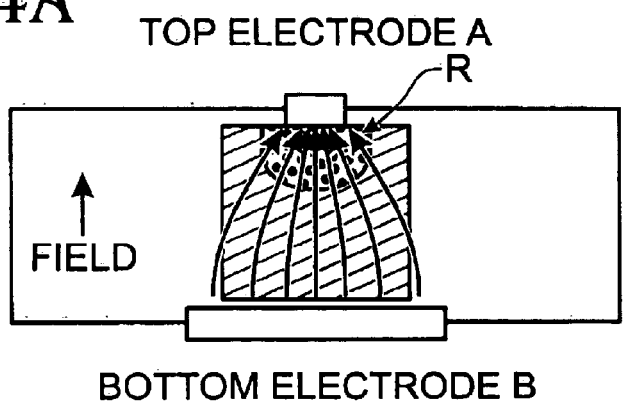
FIGS. 4a and 4b illustrate present invention memory cell programming (FIG. 4a) and erasing operations.
Figure 4B:
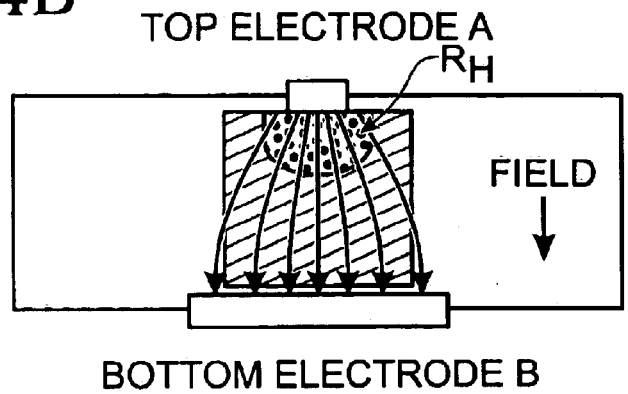

FIGS. 4a and 4b illustrate present invention memory cell programming (FIG. 4a) and erasing operations. When an electric voltage is applied across the top and the bottom electrode the field intensity and, hence, the current density near the top electrode is large. The field intensity/current density near the bottom electrode is small. As a result, only the resistivity of the memory resistor material near the top electrode is changed. There is no resistance change in EPVR material near the bottom electrode as a result of applied electric field/current near the bottom electrode. For a high-density layout, the memory device can have either a circular or square shape, which typically becomes circular after fabrication. The cell can be fabricated with conventional processes, with the only difference being that it is necessary to increase or decrease the diameter of the bottom electrode to about 20% larger or smaller than the top electrode.

FIG. 5 is a flowchart illustrating the present invention method for forming an asymmetric memory cell. Although the method is depicted as a sequence of numbered steps for clarity, no order should be inferred from the numbering unless explicitly stated. It should be understood that some of these steps may be skipped, performed in parallel, or performed without the requirement of maintaining a strict order of sequence. The method starts at Step 500.

Step 502 forms a bottom electrode having a first area. Step 504 forms an electrical pulse various resistance (EPVR) material overlying the bottom electrode. Step 506 forms a top electrode overlying the EPVR layer having a second area, less than the first area. In some aspects, the second area is at least 20% smaller than the first area. Alternately, as mentioned above, the bottom electrode may have a smaller area (at least 20% smaller) than the top electrode. Step 508 induces an electric field between the top electrode and the bottom electrode. Step 510, in response to the electric field, induces current flow through the EPVR adjacent the top electrode.

Forming a bottom electrode in Step 502 includes forming the bottom electrode from a material such as Pt, TiN, TaN, TiAlN, TaAlN, Ag, Au, or Ir. Likewise, forming a top electrode in Step 506 includes forming the top electrode from a material such as Pt, TiN, TaN, TiAlN, TaAlN, Ag, Au, or Ir. The top and bottom electrodes can be made from different materials. Forming an EPVR layer in Step 504 includes forming an EPVR layer from a material such as CMR, HTSC, or perovskite metal oxide materials.

In some aspects, inducing an electric field between the top electrode and the bottom electrode in Step 510 includes applying a negative voltage pulse between the top and bottom electrodes having an amplitude in the range of 2 to 5 volts and a time duration in the range of 1 nanosecond (ns) to 10 microseconds (µs). Then, modifying the resistance of the EPVR between the top and bottom electrodes in Step 512 includes creating a first, high resistance (100 to 10 Mohms) between the electrodes.

In other aspects, inducing an electric field between the top electrode and the bottom electrode in Step 510 includes applying a positive pulse between the top and bottom electrodes having an amplitude in the range of 2 to 5 volts and a time duration in the range of 1 ns to 10 µs. Then, modifying the resistance of the EPVR between the top and bottom electrodes in Step 512 includes creating a second resistance 100 to 1000 ohms) between the electrodes, lower than the first resistance.

In some aspects, modifying the resistance of the EPVR between the top and bottom electrodes in response to inducing current flow through the EPVR adjacent the top electrode (Step 512) includes modifying the resistance within the range of 100 ohms to 10 Mohms.

An asymmetric memory cell and a method of forming an asymmetric memory cell have been provided. A few examples have been given to explain the invention, however, the invention is not limited to merely these examples. Other variations and embodiments of the invention will occur to those skilled in the art.

We claim:

1. A method for forming an asymmetric memory cell, the method comprising:
   forming a bottom electrode having a first contact area;
   forming an electrical pulse various resistance (EPVR) material overlying the bottom electrode first contact area;
   forming a top electrode overlying the EPVR layer having a second area in contact with the EPVR material, less than the first contact area.

2. The method of claim 1 further comprising:
   inducing an electric field between the top electrode and the bottom electrode; and,
   in response to the electric field, inducing current flow through the EPVR adjacent the top electrode.

3. The method of claim 2 further comprising:
   in response to inducing current flow through the EPVR adjacent the top electrode, modifying the resistance of the EPVR between the top and bottom electrodes.

4. The method of claim 3 wherein inducing an electric field between the top electrode and the bottom electrode includes applying a negative voltage pulse between the top and bottom electrodes having an amplitude in the range of 2 to 5 volts and a time duration in the range of 1 nanosecond (ns) to 10 microseconds ($\mu$s); and,
   wherein modifying the resistance of the EPVR between the top and bottom electrodes includes creating a first, high resistance between the electrodes.

5. The method of claim 4 wherein inducing an electric field between the top electrode and the bottom electrode includes applying a positive pulse between the top and bottom electrodes having an amplitude in the range of 2 to 5 volts and a time duration in the range of 1 ns to 10 $\mu$s; and,
   wherein modifying the resistance of the EPVR between the top and bottom electrodes includes creating a second resistance between the electrodes, lower than the first resistance.

6. The method of claim 3 wherein modifying the resistance of the EPVR between the top and bottom electrodes in response to inducing current flow through the EPVR adjacent the top electrode includes modifying the resistance within the range of 100 ohms to 10 mega-ohms.

7. The method of claim 1 wherein forming a top electrode overlying the EPVR layer having a second contact area, less than the first contact area, includes the second contact area being at least 20% smaller than the first contact area.

8. The method of claim 1 wherein forming a bottom electrode includes forming the bottom electrode from a material selected from the group including Pt, TiN, TaN, TiAlN, TaAlN, Ag, Au, and Ir; and,
   wherein forming a top electrode includes forming the top electrode from a material selected from the group including Pt, TiN, TaN, TiAlN, TaAlN, Ag, Au, and Ir.

9. The method of claim 1 wherein forming an EPVR layer includes forming an EPVR layer from a material selected from the group including colossal magnetoresistance (CMR), high temperature super conducting (HTSC), and perovskite metal oxide materials.

10. A method for forming an asymmetric memory cell, the method comprising:
    forming a bottom electrode having a first contact area;
    forming an electrical pulse various resistance (EPVR) material overlying the bottom electrode first contact area;
    forming a top electrode overlying the EPVR layer having a second area in contact with the EPVR material, greater than the first contact area.

11. The method of claim 10 wherein forming a top electrode overlying the EPVR layer having a second contact area, greater than the first contact area, includes the first contact area being at least 20% smaller than the second contact area.

12. An asymmetric memory cell comprising:
    a bottom electrode having a first contact area;
    an electrical pulse various resistance (EPVR) material layer overlying the bottom electrode first contact area; and,
    a top electrode overlying the EPVR layer having a second area in contact with the EPVR materials, less than the first contact area.

13. The memory cell of claim 12 wherein the top electrode second contact area is at least 20% less than the bottom electrode first contact area.

14. The memory cell of claim 13 wherein the bottom electrode is a material selected from the group including Pt, TiN, TaN, TiAlN, TaAlN, Ag, Au, and Ir; and,
    wherein the top electrode is a material selected from the group including Pt, TIN, TaN, TiAlN, TaAlN, Ag, Au, and Ir.

15. The memory cell of claim 13 wherein the EPVR layer has a first overall resistance, as measured between the top and bottom electrodes, responsive to a first voltage pulse, applied between the top and bottom electrodes; and,
    wherein the EPVR layer has a second overall resistance, less than the first resistance, responsive to a second voltage pulse.

16. The memory cell of claim 15 wherein the EPVR layer first resistance is in the range of 100 ohms to 10 mega-ohms, responsive to the first voltage pulse having an negative amplitude in the range of 2 to 5 volts and a time duration in the range of 1 nanosecond (ns) and 10 microseconds ($\mu$s).

17. The memory cell of claim 16 wherein the EPVR layer second resistance is in the range of 100 ohms to 1 kohm, responsive to the second voltage pulse having an positive amplitude in the range of 2 to 5 volts and a time duration in the range of 1 ns to 10 $\mu$s.

18. The memory cell of claim 12 wherein the EPVR layer is a material selected from the group including colossal magnetoresistance (CMR), high temperature super conducting (HTSC), and perovskite metal oxide materials.

19. An asymmetric memory cell comprising:
    a bottom electrode having a first contact area;
    an electrical pulse various resistance (EPVR) material layer overlying the bottom electrode first contact area; and,
    a top electrode overlying the EPVR layer having a second area in contact with the EPVR material, greater than the first contact area.

20. The memory cell of claim 19 wherein the bottom electrode first contact area is at least 20% less than the top electrode second contact area.

* * * * *